United States Patent
Agarwal et al.

(10) Patent No.: US 7,532,078 B2
(45) Date of Patent: May 12, 2009

(54) SCANNABLE VIRTUAL RAIL METHOD AND RING OSCILLATOR CIRCUIT FOR MEASURING VARIATIONS IN DEVICE CHARACTERISTICS

(75) Inventors: Kanak B. Agarwal, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/673,025

(22) Filed: Feb. 9, 2007

(65) Prior Publication Data
US 2008/0195337 A1    Aug. 14, 2008

(51) Int. Cl.
*H03F 3/66* (2006.01)
*G01R 31/26* (2006.01)

(52) U.S. Cl. .................... 331/57; 331/68; 331/11; 324/763; 324/765; 324/769; 327/158; 327/156

(58) Field of Classification Search ................ 324/763, 324/765, 769; 331/57, 68, 176, 185, 186; 327/156
See application file for complete search history.

(56) References Cited

U.S. PATENT DOCUMENTS

| | | | | |
|---|---|---|---|---|
| 6,414,557 B1 * | 7/2002 | Liu | ............................ | 331/57 |
| 6,570,456 B2 * | 5/2003 | Mano et al. | .................... | 331/11 |
| 2002/0118072 A1 * | 8/2002 | Liu | ............................ | 331/57 |

OTHER PUBLICATIONS

U.S. Appl. No. 11/432,186, filed Aug. 3, 2006, Agarwal et al.
U.S. Appl. No. 11/260,571, filed Oct. 27, 2005, Chuang et al.
Bhushan, et al. "Ring Oscillator Based Technique for Measuring Variability Statistics", International Conference on Microelectronic Test Structures Mar. 6-9, 2006, IEEE Press 2006 pp. 87-92.
Bhushan, et al., "Ring Oscillators for Process Tuning and Variability Control", IEEE Transactions in Semiconductor Manufacturing, Feb. 2006, pp. 10-18, vol. 19, No. 1, IEEE Press.
Ketchen, et al., "High Speed Test Structures for In-Line Process Monitoring and Model Calibration", Proceedings of the IEEE 2005 Int. Conference on Microelectronic Test Structures, pp. 33-38, vol. 18, Apr. 2005, IEEE Press.

* cited by examiner

*Primary Examiner*—Vibol Tan
(74) *Attorney, Agent, or Firm*—Mitch Harris, Atty at Law, LLC; Andrew M. Harris; Casimer K. Salys

(57) ABSTRACT

A scannable virtual rail method and ring oscillator circuit for measuring variations in device characteristics provides the ability to study random device characteristic variation as well as systematic differences between N-channel and P-channel devices using a ring oscillator frequency measurement. The ring oscillator is operated from at least one virtual power supply rail that is connected to the actual power supply rail by a plurality of transistors controlled by a programmable source. The transistors are physically distributed along the physical distribution of the ring oscillator elements and each can be enabled in turn and the variation in ring oscillator frequency measured. The ring oscillator frequency measurements yield information about the variation between the transistors and N-channel vs. P-channel variation can be studied by employing positive and negative virtual power supply rails with corresponding P-channel and N-channel control transistors.

10 Claims, 6 Drawing Sheets

US 7,532,078 B2

SCANNABLE VIRTUAL RAIL METHOD AND RING OSCILLATOR CIRCUIT FOR MEASURING VARIATIONS IN DEVICE CHARACTERISTICS

BACKGROUND OF THE INVENTION

1. Field of the Invention

The present invention is related to integrated circuit characterization methods and circuits, and more particularly to a circuit and method for measuring variations in device characteristics in a test integrated circuit.

2. Description of Related Art

Characterization integrated circuits are in common use to evaluate designs on processes and have become increasingly necessary as processes have shrunk. Ring oscillator circuits are frequently used in such designs to study device characteristic variations that lead to variations in circuit parameters such as delay time. Performance screen ring oscillators (PSROs) are implemented along with functional circuits in a production integrated circuit to assist in production screening and as a design/process improvement tool. Since it is relatively easy to accurately measure the output frequency of a ring oscillator, and the output frequency is typically directly related to delay time, frequency measurements provide a effective means for studying process and design effects on delay time.

However, ring oscillator test circuits typically do not provide information about random local variation of device characteristics, nor of the systematic and variational differences between the P-channel devices and N-channel devices. Since the frequency of oscillation of the ring oscillator is dependent on the aggregate delay around the ring, a ring oscillator test typically yields only oscillator-to-oscillator variation information, which may be die-to-die or among multiple ring oscillators on a die. There is no measurement of local variation within the ring oscillator itself.

Therefore, it would be desirable to provide a characterization method and ring oscillator circuit for determining device characteristic variation within the ring oscillator and between P-channel and N-channel devices within the ring oscillator, so that local random variation, systematic deviation and N-channel to P-channel skew can be measured.

SUMMARY OF THE INVENTION

The above objectives of measuring local random, systematic and P-channel to N-channel variations in device characteristics is achieved in a ring oscillator circuit and method.

The ring oscillator is operated from at least one virtual power supply rail that is connected to the actual power supply rail by a plurality of header transistors that are physically distributed along the path of and in proximity to ring oscillator stages. However, there may be any number of ring oscillator stage and header transistors, so there is no particular correspondence required. The gates of the transistors are controlled by a set of programmable elements, such as a scan latch, so that each transistor may be independently enabled. By selecting each transistor in turn, the variation among the transistors can be measured by the impact on the frequency of the ring oscillator. Two virtual supply rails may be employed (e.g., virtual $V_{DD}$ and virtual ground), with a P-channel plurality of transistors coupling the higher voltage power supply rail and an N-channel plurality of transistors coupling the lower voltage power supply rail, so that the variation in ring oscillator frequency can be studied with one transistor enabled on one virtual power supply rail, while multiple transistors are enabled on the other virtual power supply rail.

In one embodiment, the programmable elements are commonly connected to the gates of the P-channel header transistors and the N-channel footer transistors, so that one transistor is enabled on a first virtual power supply rail and all but one transistor is enabled on the second virtual power supply rail. In another embodiment, a programmable element is provided for each controlled transistor, so that all transistors may be enabled on one virtual power supply rail and each individual transistor scanned on the other virtual power supply rail.

The programmable elements may also be configured as a ring (or two rings for the independent power supply rail control embodiment) so that the bit enabling individual transistor may be rotated through the scan chain under control of the scan clock, rather than requiring a complete boundary scan to enable each individual transistor.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to a characterization circuit and method performed using a ring oscillator circuit in accordance with an embodiment of the present invention. The ring oscillator has at least one virtual power supply rail that is coupled to a power supply by a plurality of transistors that are physically distributed along the layout of the ring oscillator stages. By enabling each transistor in turn, while disabling the others, the variation of device characteristics, such as threshold voltage and/or channel resistance of the transistors can be observed from changes in the output frequency of the ring oscillator. The method may be a computer-controlled method partially embodied in a computer program having program instructions for carrying out the method by controlling a die/wafer tester to set the state of the virtual power supply rail transistors. Two virtual power supply rails, a higher voltage (e.g., $V_{DD}$) and a lower voltage (e.g., ground) can be provided to the ring oscillator and used to observe differences between the N-channel and P-channel device characteristic variations in the test circuit. The gates of each of the pluralities of transistors can be controlled by boundary scan latches, which may be scanned to advance the position of the bit enabling each transistor in turn. The plurality of transistors that couple the second virtual power supply rail opposite the transistors under test may either be all enabled, or if a common control signal is used for each position, all transistors except the transistor that is coupled to the second power supply rail and corresponding in position to the transistor being measured are enabled.

Figure 1:
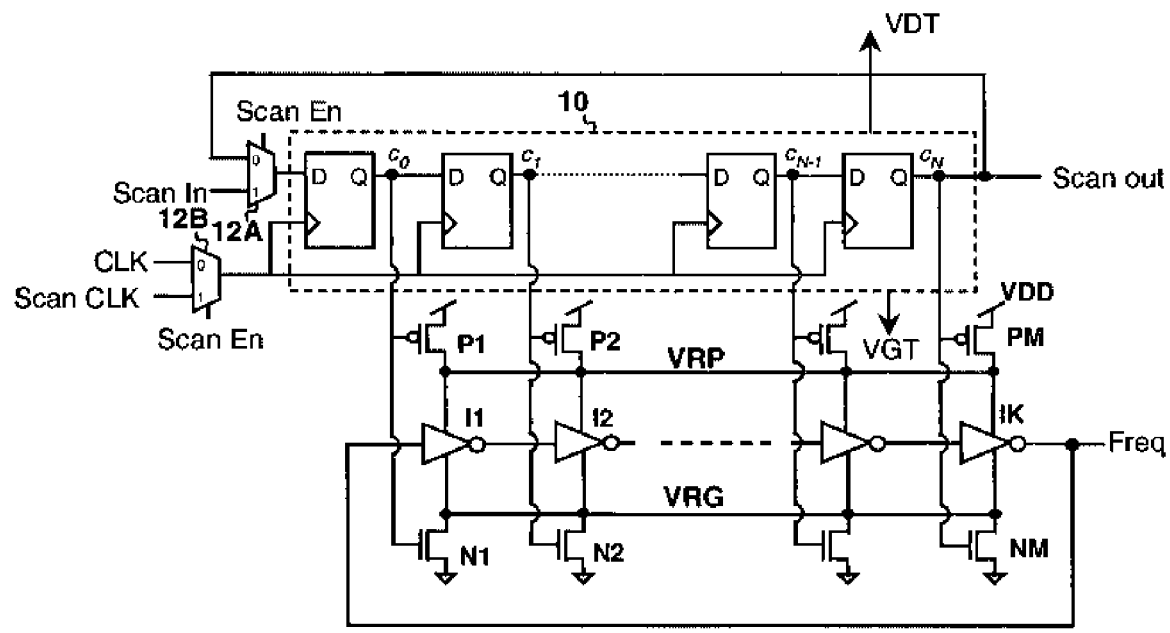
FIG. 1 is a schematic diagram depicting a test circuit according to a embodiment of the present invention.

Referring now to FIG. 1, a ring oscillator test circuit in accordance with an embodiment of the present invention is shown. In the depicted embodiment, the ring oscillator is formed by a plurality of inverters I1-IK that are physically distributed in a die or wafer kerf circuit and provide the ring oscillator elements. A plurality of P-channel transistors P1-PM couple a higher voltage power supply rail VDD to a virtual power supply rail VRP of inverters I1-IK and are controlled by the bit outputs of a scan latch 10. A second plurality of N-channel transistors N1-NM couple a virtual lower voltage (ground) power supply rail to a virtual power supply rail VRG of inverters I1-IK and are also controlled by the bit outputs of scan latch 10. The number of ring oscillator stages K and the number of test transistors M on each rail are independent. However, transistors N1-NM and P1-PM should be distributed physically along the layout of the ring oscillator stages (inverters I1-IK in the exemplary embodiment). A selector 12A is controlled by a scan enable signal Scan En under tester control to receive an input bit sequence from input signal Scan In when scan latch 10 is being programmed, or to receive feedback from output signal Scan Out in response to a clock signal CLK, that rotates the bit positions of the sequence loaded into scan latch 10 during testing. A selector 12B provides for selection between the scan clock signal Scan Clk that loads values into scan latch 10 and a clock signal CLK, which is pulsed between each frequency measurement.

To study variations in transistors P1-PM a sequence of "1" bits with a leading zero "0" are loaded into scan latch 10 and the frequency of the ring oscillator output signal Freq is measured and stored by a tester. The device characteristics of transistor P1 are strongly indicated in the measured frequency, as transistor P1 is enabled, while transistors P2-PM are disabled. In the depicted configuration, transistor N1 will be disabled, while transistors N2-NM are enabled. The impact of transistor N1 being disabled is generally negligible, since a large number of transistors N2-NM are enabled. However, the wire capacitance of the virtual ground rail VRG should be made sufficiently high and the wire resistance made sufficiently low to avoid local AC effects.

In order to observe the random device characteristic variation across the test circuit, the "enable" bit position is shifted around scan latch 10 and the frequency measurement repeated as each of transistors P2-PM is individually enabled by the progress of the preset "0" bit value through scan latch 10 as clocked by clock signal CLK. After the P-channel characteristics have been determined, another bit pattern may be loaded into scan latch 10: a sequence of zero "0" bits with a leading "1". This second sequence enables only one of N-channel transistors N1-NM as it is rotated through scan latch, and provides for measurement of the individual device characteristics of transistors N1-NM as reflected in the ring oscillator output frequency, while all but a corresponding one of transistors P1-PM are enabled. The second bit pattern is then shifted to measure the characteristics of transistors N2-NM as was performed for the P-channel measurements described above. While the depicted arrangement for clocking the enable bit positions through scan latch 10 provides for reduced test time since the bit pattern does not have to be scanned in for each measurement, it is understood that selectors 12A and 12B are not required and that the control signals provided to the gates of transistors P1-PM and N1-NM can alternatively be scanned in for each measurement, or may be provided by some other means such as a parallel programmed register.

After the individual devices (transistors P1-PM and transistor N1-NM) have been characterized by the ring oscillator frequency tests, the frequency variation of the ring oscillator can be mapped to threshold voltage variation by selecting the transistor corresponding to the mean-valued frequency from each test (N-channel and P-channel), sweeping the gate voltage of the mean-valued transistor and measuring the ring oscillator frequency variation versus applied gate voltage. For this purpose, scan latch 10 may be provided with power supply inputs VDT and VGT that may be provided through a tester pad and swept, so that the gate voltages of transistors P1-PM and transistor N1-NM can be swept. The only gate that must be swept is the gate of the solitary enabled transistor, and therefore upon selecting the mean-valued P-channel transistor, VGT is swept, with all other P-channel transistor gates held at the ordinary drain voltage (VDD) and upon selecting the mean-valued N-channel transistor, VDT is swept, with the other N-channel transistor gates held at ground. As an alternative, individual selector can be provided at the gates of transistors P1-PM and N1-NM with a scan latch or other mechanism for providing the selection signal. The selector inputs include a pad for the application of VGT or VDT and the corresponding output of scan latch 10 is provided to the other selector input at each device.

Figure 2:
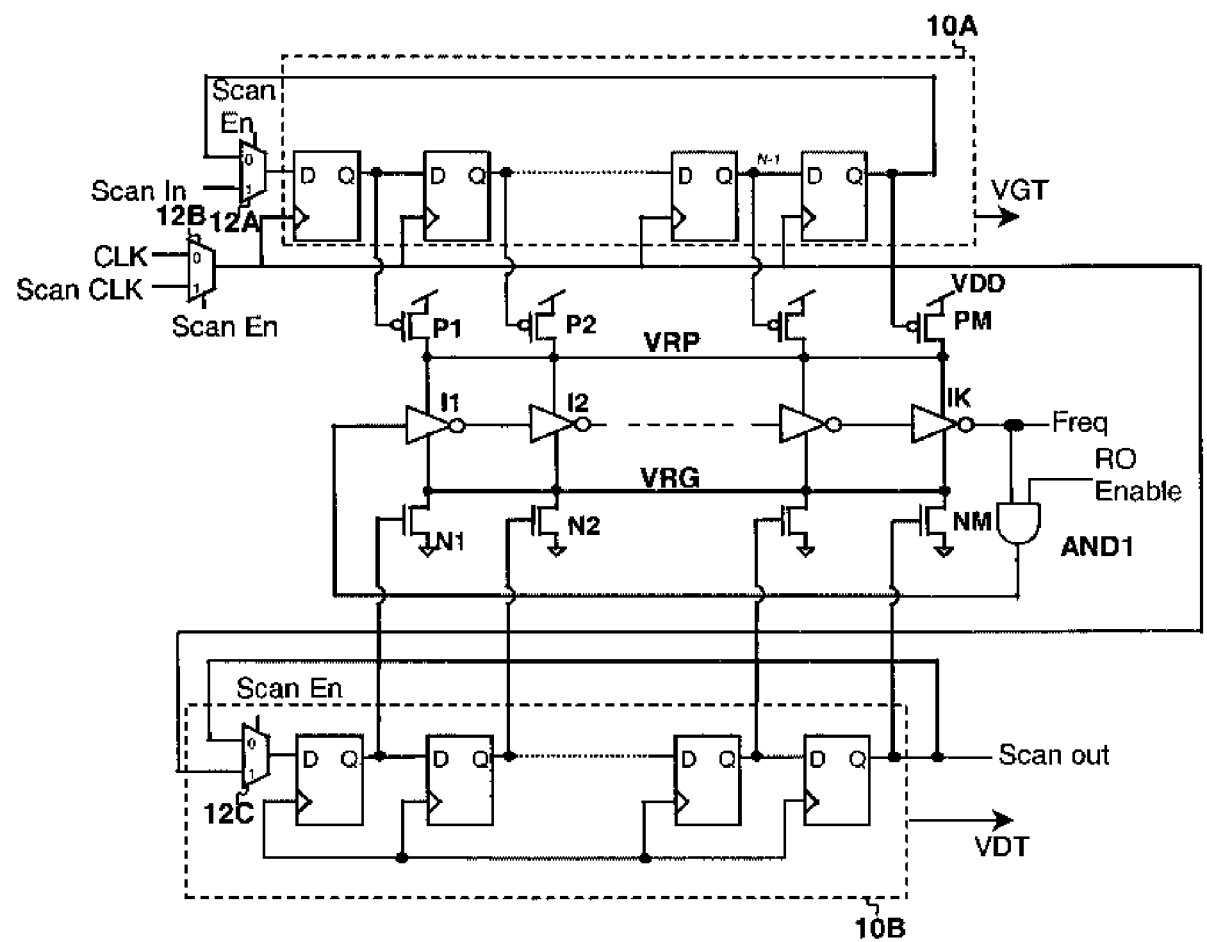
FIG. 2 is a schematic diagram depicting a test circuit according to another embodiment of the present invention.

Referring now to FIG. 2, a ring oscillator test circuit in accordance with another embodiment of the present invention is shown. The depicted circuit is similar and is operated in a manner similar to the test circuit of FIG. 1, so only difference between them are described in detail below. In the circuit of FIG. 2 a sequence can be loaded into scan latches 10A and 10B, which enables all of the transistors coupling the virtual power supply rail opposite the transistor being studied. Following the sequence of the tests described above, scan latch 10A is loaded with a sequence of "1" bits with a leading zero "0", which is preceded by a sequence of all "1" bits to fill scan latch 10B to enable all of transistors N1-NM. After all of the P-channel transistors P1-PM are evaluated, scan latch 10B is loaded with a sequence of "0" bits with a leading zero "1", which is followed by a sequence of all "0" bits to fill scan latch 10A enabling all of transistors P1-PM. An additional selector 12C is provided for local feedback around scan latch 12C, so that the bit position enabling each of transistors N1-NM can be shifted and leading positions properly filled. Optional logical AND gate AND1 can be provided to disable the ring oscillator by breaking the feedback path when the enable signal RO Enable is de-asserted. Multiple ring oscillators and virtual power supply rail transistor sets can then be connected to the outputs of scan latches 10A-10B, so that multiple ring oscillators can be operated from the same scanning mechanism. For the application of VGT and VDT as described above, VGT is provided to scan latch 10A and VDT is provided to scan latch 10B. Individual gate signal selectors can be used as an alternative for gate voltage sweeping, as described above with reference to FIG. 1.

Figure 3:
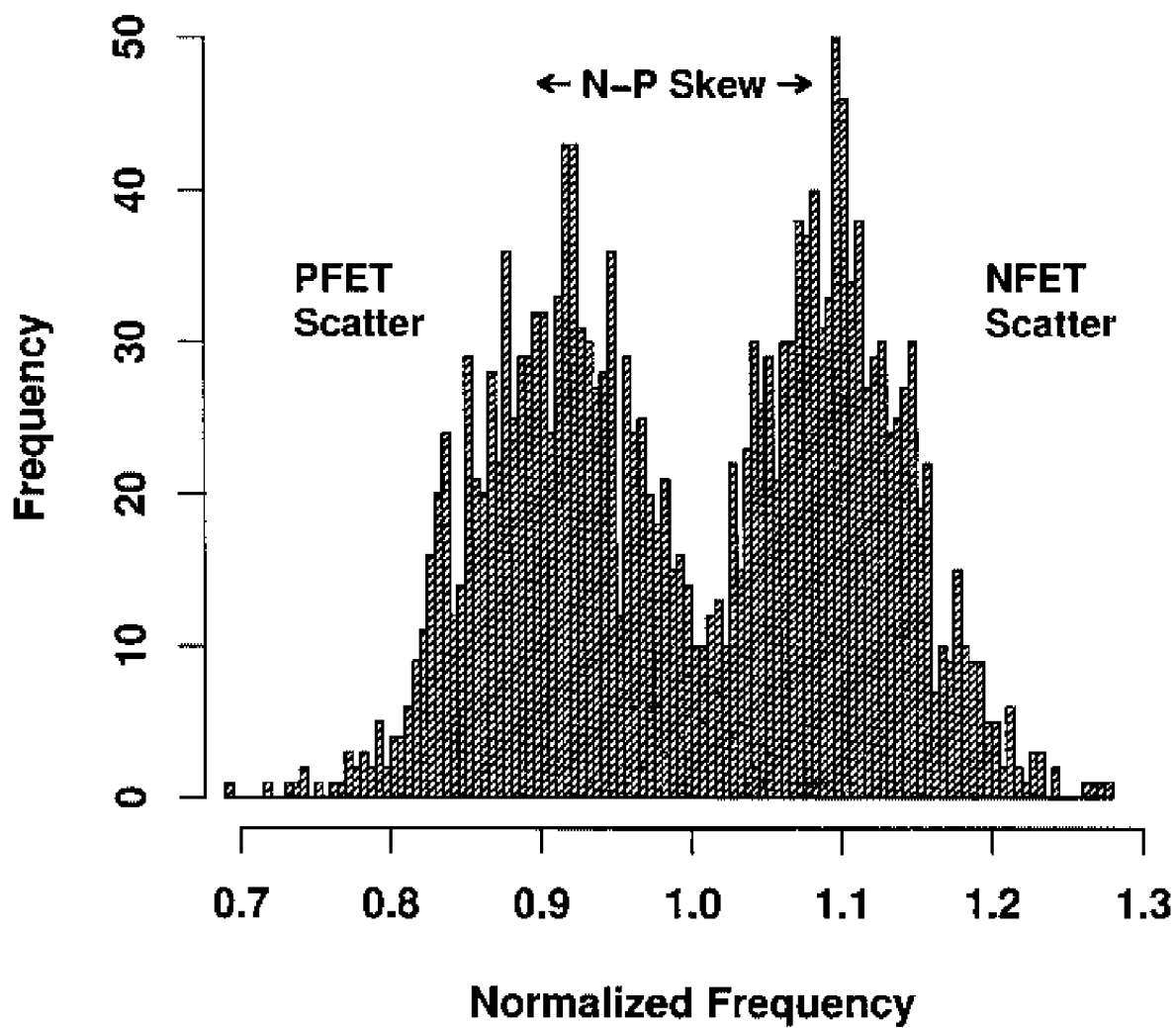
FIG. 3 is a graph depicting measurement results of a test methodology in accordance with an embodiment of the invention.

Referring now to FIG. 3, a graph is shown depicting results of a measurement as may be made and displayed by a computer system performing measurement methods in accordance with embodiment of the present invention. The horizontal axis corresponds to a normalized ring oscillator frequency and the vertical axis to the frequency of occurrence of a particular normalized ring oscillator frequency. As shown, two distinct peaks are present in the distribution that correspond to the P-channel and N-channel characteristics. The difference between the peak positions is a measure of the nominal skew between the P-channel and N-channel device characteristics, while the shape and width of each lobe shows the deviation of the random variation of P-channel and N-channel characteristics from their nominal values, respectively. The depicted graph can be compared to results from other dies and standard values for process/part screening and for design information.

Figure 4:
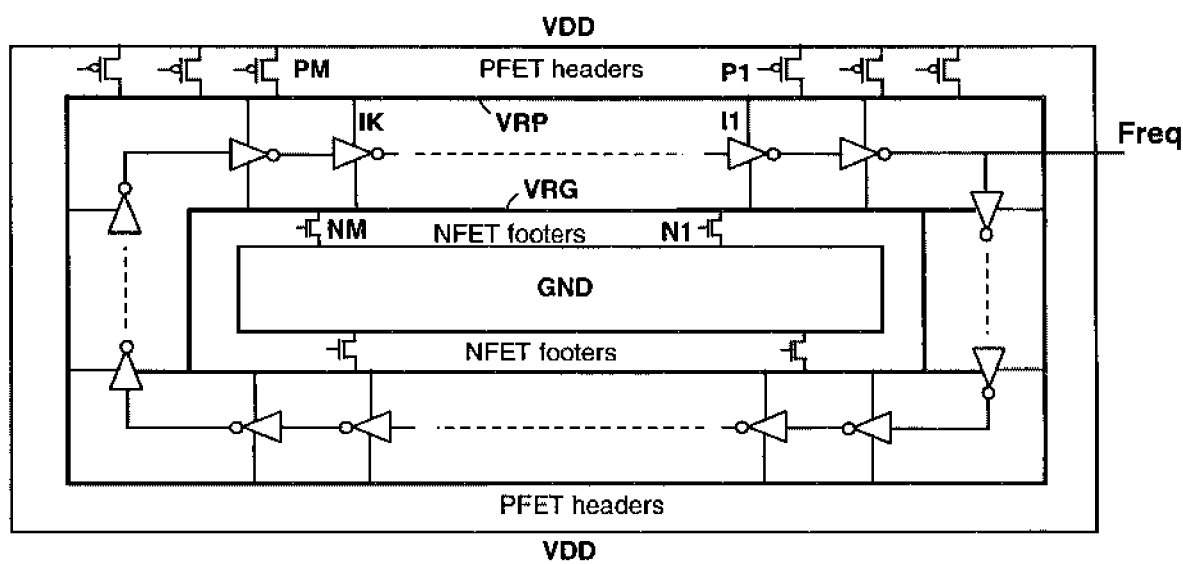
FIG. 4 is a pictorial diagram of a circuit layout in accordance with an embodiment of the invention.

Referring now to FIG. 4, a layout that may be employed for the circuits of FIG. 1 and FIG. 2 is shown in accordance with an embodiment of the present invention. The circuit is laid out as a set of concentric rings, the outermost and innermost of which are the power supply rails, VDD and GND, respectively. The N-channel FET footers N1-NM that couple ground rail GND to negative virtual supply rail VRG are disposed around the ground ring and the ring oscillator itself, implemented by inverters I1-IK. Outside of the ring oscillator is a ring including P-channel header transistors P1-PM, which couple the ring oscillator to the outside VDD power supply rail. The above-described layout provides a pattern that can be replicated multiple times on a die, is scalable and ensures that each P-channel header and N-channel footer FETs (P1-PM and N1-NM) are placed symmetrically on the virtual power supply rail rings.

Figure 5:
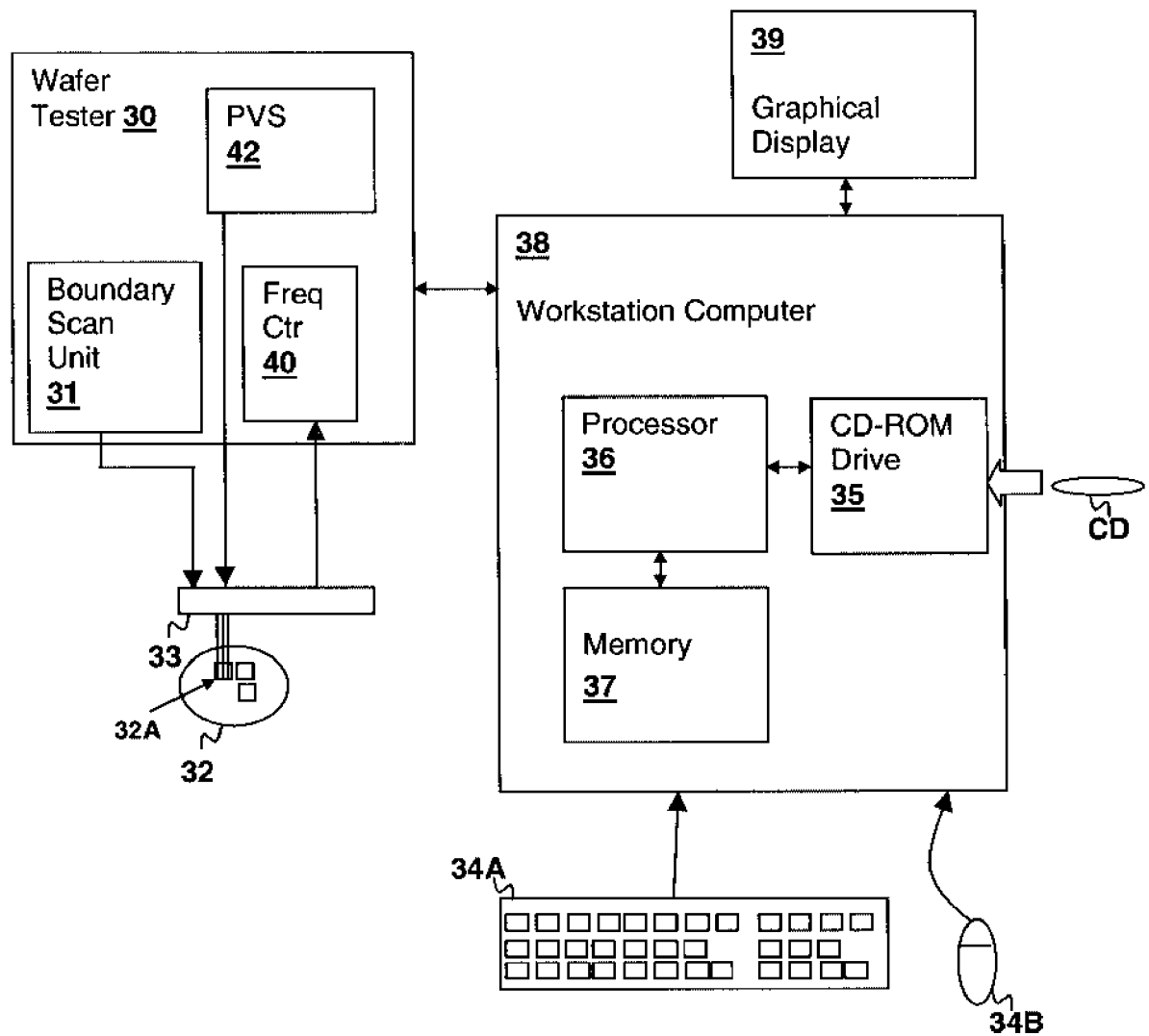
FIG. 5 is a block diagram of a wafer test system that may be used to perform tests using methods and circuits in accordance with embodiments of the invention.

Referring now to FIG. 5, a wafer test system in which a method according to an embodiment of the invention is performed, is shown. A wafer tester 30 includes a boundary scan unit 31 for providing stimulus to a die or kerf circuit 32A on a wafer under test 32, via a probe head 33 having electrical test connections to die/kerf circuit 32A. Wafer tester 30 also includes a programmable voltage supply 42, which may be used to vary the supply voltage provided to the test circuits of the present invention and is die/kerf circuit 32A via probe head 33. A frequency counter 40 is provided to measure the frequency of the one or more ring oscillators included in die/kerf circuit 32A.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the measurements described above are performed and measurements collected and stored in memory 37 and/or other media storage such as a hard disk. A CD-ROM drive 35 provides for import of program instructions in accordance with embodiments of the present invention that are stored on media such as compact disc CD. Workstation computer 38 is also coupled to a graphical display 39 for displaying program output such as distributions of the ring oscillator frequencies provided by embodiments of the present invention as exemplified by that illustrated in FIG. 3. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 3 depicts a configuration suitable for sequential test of a plurality of dies on a wafer, the depicted system is illustrative and not a limitation of the present invention. Probe head 33 may be a multi-die full wafer probe system, or may comprise multiple probe heads for simultaneously testing multiple wafers on a single or multiple die basis. Additionally, while boundary scan control of the ring oscillator header transistors is illustrated, the techniques of the present invention may also be applied to execution of test code from a processor incorporated on wafer 32 with appropriate interface to registers or scan latches to control the header transistors, as well. The resultant generated display or data exported from workstation computer 38 may take the form of graphical depictions of the ring oscillator frequencies, or may other graphical or numerical information that describes the transistor characteristics and their variation across the circuit.

Figure 6:
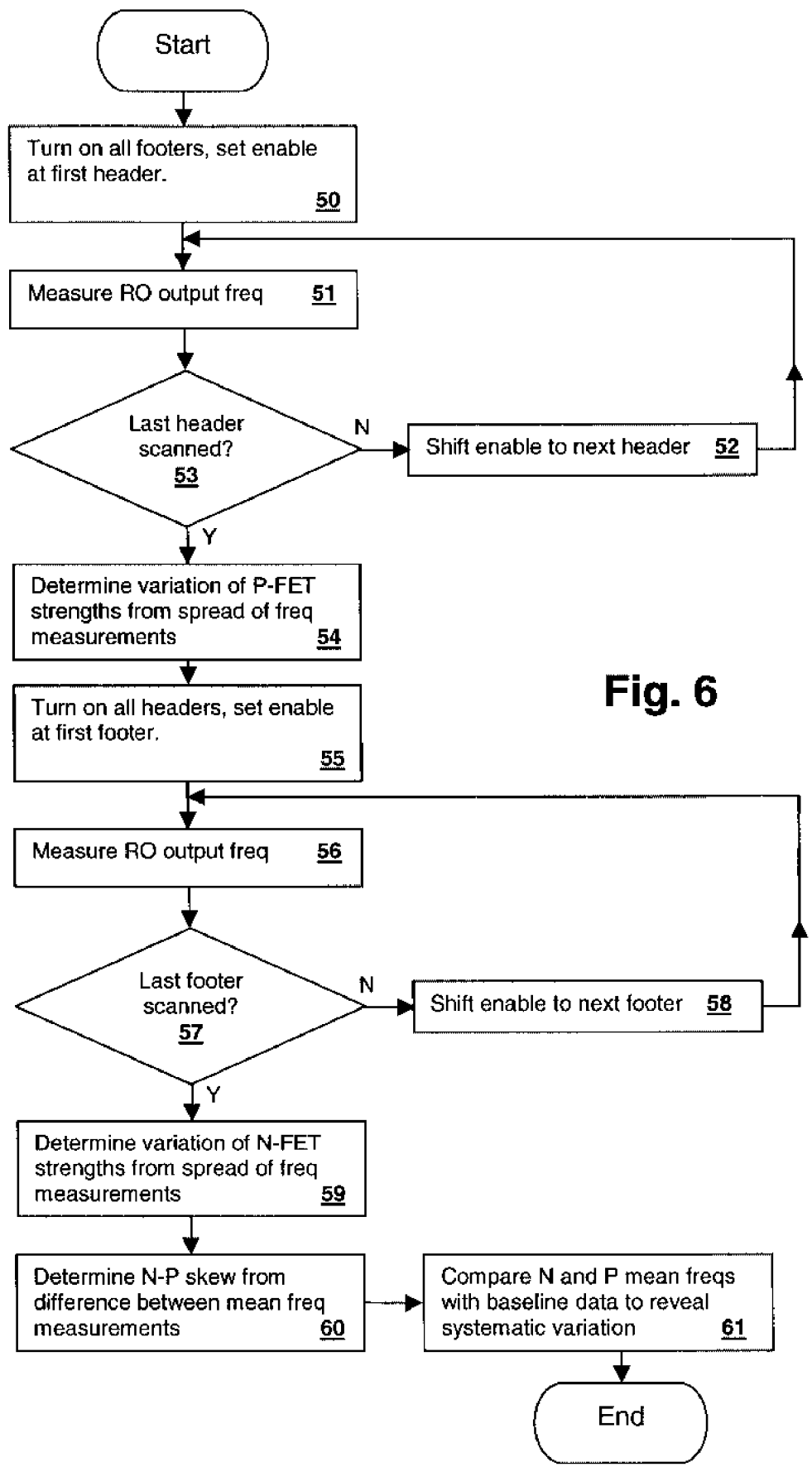
FIG. 6 is a flow chart of a method in accordance with an embodiment of the present invention.

Referring now to FIG. 6, a method in accordance with an embodiment of the invention is depicted in a flowchart. The illustrated method is that described with respect to the circuit of FIG. 2, but it is understood that with the exception of the single opposing rail transistor that is disabled in the circuit of FIG. 1 and the particulars of the scan latches, the operation is the same. The first header transistor is enabled and all of the footer transistors, while the remaining header transistors are disabled (step 50) and the ring oscillator frequency is measured and stored (step 51). Until the last header is scanned (decision 53), the enable bit is shifted to the next header transistor (step 52). After the last header transistor is scanned (decision 53), the variation of P-FET strengths are determined from the spread of frequency measurements (step 54). Next, all of the header transistors are enabled and all of the footers disabled, except the first footer, which is enabled (step 55) and the ring oscillator frequency is measured and stored (step 56). Until the last footer is scanned (decision 57), the enable bit is shifted to the next footer transistor (step 58). After the last footer transistor is scanned (decision 57), the variation of N-FET strengths are determined from the spread of frequency measurements (step 59). Finally, the N-channel to P-channel device strength/frequency measurement skew are determined from the measured frequencies (step 60) and the N-channel and P-channel mean frequency measurements are compared with baseline data (and any data gathered from other ring oscillators on the die) to reveal systematic variation (step 61).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A computer-controlled method for characterizing transistors in a test circuit including a ring oscillator and interfaced to a computer system the method comprising:
    conducting operating current to/from said ring oscillator from a first virtual power supply rail;
    conducting current to/from said first virtual power supply rail through a first plurality of transistors, each having a gate controlled by an output of a corresponding one of a first plurality of programmable elements controlled by said computer system;
    setting first states of said first plurality of programmable elements under control of said computer system such that individual ones of said first plurality of transistors are enabled;
    measuring an output frequency of said ring oscillator for each of said first states of said plurality of programmable elements set by said setting and storing results of said measuring; and
    generating results in conformity with results of said measuring in a memory of said computer system, whereby variation of characteristics of said plurality of transistors is revealed.

2. The method of claim 1, further comprising:

conducting operating current from/to said ring oscillator from a second virtual power supply rail;

conducting current from/to said second virtual power supply rail through a second plurality of transistors, of doping type differing from that of said first plurality of transistors, each having a gate controlled by an output of a corresponding one of a second plurality of programmable elements; and setting second states of said second plurality of programmable elements under computer control such that individual ones of said second plurality of transistors are enabled, and wherein said measuring further measures said output frequency of said ring oscillator for each of said second states of said plurality of programmable elements set by said setting second states.

3. The method of claim 2, wherein said setting first states is performed by:

scanning a bit stream into a scan latch comprising said programmable elements, wherein a single bit in said bit stream is set to enable a single one of said first plurality of transistors; and rotating a value in said scan latch to shift said single bit to enable each of said first plurality of transistors in sequence.

4. The method of claim 3, wherein said first plurality of programmable elements and said second plurality of programmable elements are the same plurality of programmable elements, and wherein said setting first states enables all but one of said second plurality of transistors in each of said first states, and wherein said setting second states enables all but one of said first plurality of transistors in each of said second states.

5. The method of claim 3, wherein said first plurality of programmable elements and said second plurality of programmable elements are separate pluralities of programmable elements, and wherein said setting first states further sets said second plurality of programmable elements to enable all of said second plurality of transistors in each of said first states, and wherein said setting second states further sets said first plurality of programmable elements to enables all of said first plurality of transistors in each of said second states.

6. The method of claim 2, wherein said setting first states is performed by:

scanning a bit stream into a scan latch comprising said programmable elements, wherein a single bit in said bit stream is set to enable a single one of said first plurality of transistors; and rotating a value in said scan latch to shift said single bit to enable each of said first plurality of transistors in sequence.

7. The method of claim 2, further comprising determining a difference between said output frequency of said ring oscillator for said first states and said second states, whereby a skew between device characteristics of said first plurality of transistors and of said second plurality of transistors.

8. The method of claim 1, further comprising determining a width of a distribution of said output frequency of said ring oscillator, whereby a magnitude of random variation of device characteristics of said first plurality of transistors can be determined.

9. The method of claim 1, further comprising:

determining a mean of a distribution of said output frequency of said ring oscillator; and comparing said mean to baseline data, whereby systematic variation in said device characteristics of said first plurality of transistors can be determined.

10. The method of claim 1, wherein said setting first states is performed by:

scanning a bit stream into a scan latch comprising said programmable elements, wherein a single bit in said bit stream is set to enable a single one of said first plurality of transistors; and rotating a value in said scan latch to shift said single bit to enable each of said first plurality of transistors in sequence.

* * * * *